(12) United States Patent
Laletin

(10) Patent No.: US 6,504,409 B1
(45) Date of Patent: Jan. 7, 2003

(54) CONTROLLER FOR GENERATING A PERIODIC SIGNAL WITH AN ADJUSTABLE DUTY CYCLE

(75) Inventor: William H. Laletin, Slidel, LA (US)

(73) Assignee: K-Tek Corporation, Prairieville, LA (US)

( * ) Notice: Subject to any disclaimer, the term of this patent is extended or adjusted under 35 U.S.C. 154(b) by 0 days.

(21) Appl. No.: 09/836,028

(22) Filed: Apr. 17, 2001

(51) Int. Cl.[7] .............................................. H03K 3/017
(52) U.S. Cl. ........................ 327/175; 327/35; 327/561
(58) Field of Search ................................ 327/175, 176, 327/172, 31, 35, 36, 37, 560, 561; 330/259, 260, 269, 270, 293

(56) References Cited

U.S. PATENT DOCUMENTS

| | | | |
|---|---|---|---|
| 3,474,337 | 10/1969 | Petrick | 324/58.5 |
| 3,695,107 | 10/1972 | Hertz et al. | 73/290 |
| 3,703,829 | 11/1972 | Dougherty | 73/290 |
| 3,832,900 | 9/1974 | Ross | 73/290 |
| 3,995,212 | 11/1976 | Ross | 73/304 |
| 4,110,692 | * 8/1978 | Pradal | 327/558 |
| 4,359,902 | 11/1982 | Lawless | 73/290 |
| 4,489,601 | 12/1984 | Rao et al. | 73/290 |
| 4,621,264 | 11/1986 | Yashiro et al. | 342/124 |
| 4,672,341 | 6/1987 | Axell | 333/247 |
| 4,797,621 | 1/1989 | Anderson | 324/533 |
| 4,843,255 | 6/1989 | Stuebing | 327/176 |
| 4,890,065 | 12/1989 | Laletin | 328/155 |
| 5,124,597 | 6/1992 | Stuebing et al. | 327/276 |
| 5,274,271 | 12/1993 | McEwan | 307/108 |
| 5,315,164 | 5/1994 | Broughton | 327/175 |
| 5,345,471 | 9/1994 | McEwan | 375/1 |
| 5,410,191 | 4/1995 | Miura | 327/227 |
| 5,422,607 | 6/1995 | McEwan | 333/20 |
| 5,438,867 | 8/1995 | Va Der Pool | 73/290 |
| 5,457,990 | 10/1995 | Oswald et al. | 73/290 |
| 5,517,198 | 5/1996 | McEwan | 342/89 |
| 5,519,342 | 5/1996 | McEwan | 327/94 |
| 5,543,720 | 8/1996 | Edvardsson | 324/643 |
| 5,563,605 | 10/1996 | McEwan | 342/202 |
| 5,594,449 | 1/1997 | Otto | 342/124 |
| 5,609,059 | 3/1997 | McEwan | 73/290 |
| 5,610,611 | 3/1997 | McEwan | 342/89 |
| 5,630,216 | 5/1997 | McEwan | 455/215 |
| 5,682,114 | 10/1997 | Ohta | 327/276 |
| 5,764,300 | * 6/1998 | Badger | 327/156 |
| 5,792,956 | * 8/1998 | Li | 327/562 |
| 5,933,039 | 8/1999 | Hui et al. | 327/262 |
| 6,055,287 | 4/2000 | McEwan | 375/376 |
| 6,060,915 | 5/2000 | McEwan | 327/94 |
| 6,060,922 | 5/2000 | Chow et al. | 327/175 |
| 6,137,438 | 10/2000 | McEwan | 342/134 |

\* cited by examiner

*Primary Examiner*—Timothy P. Callahan
*Assistant Examiner*—An T. Luu
(74) *Attorney, Agent, or Firm*—Cox & Smith Incorporated

(57) ABSTRACT

A controller that is linearly responsive to an input voltage provides continuously adjustable control of the width of a periodically repeating digital pulse, thereby achieving a linear voltage to duty-cycle ratio transfer function. The circuit of the present invention includes a master clock input, a ratio control voltage input, a controlled duty cycle clock output, a high gain amplifier configured as an integrator having differential inputs, each equipped with a low pass filter, a controlled current source, a resettable timing capacitor, a threshold detector and a reference pulse generator.

11 Claims, 3 Drawing Sheets

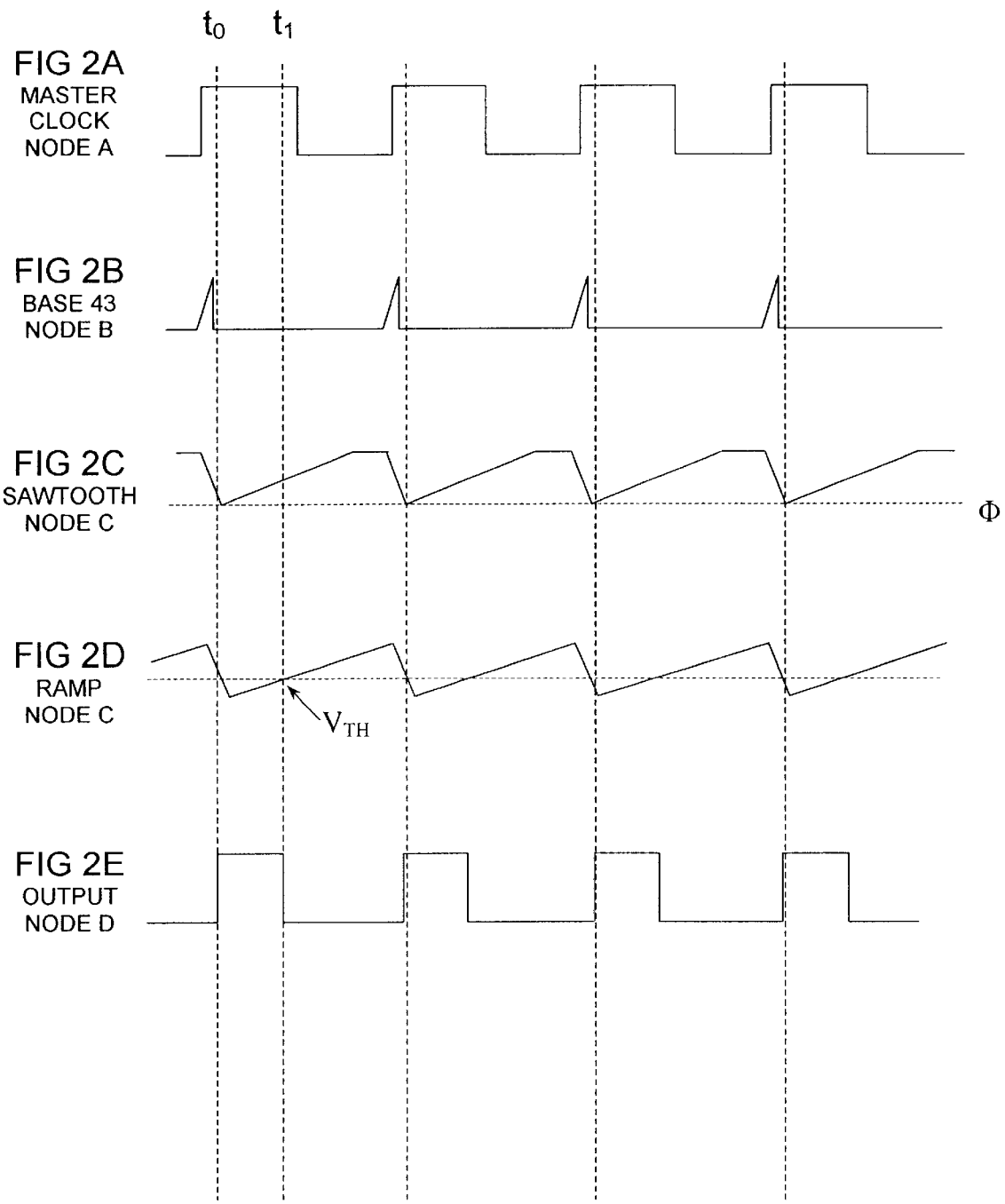

MASTER CLOCK
NODE A

RC OUTPUT
NODE E

CLEAR THRESHOLD

INVERT GATE DELAY

GATE 50
NODE D

FLIP-FLOP GATE DELAY

Q
NODE F $\overline{Q}$
NODE H

DUTY CYCLE
CLOCK OUT
NODE I

CONTROLLED TIME DELAY
INTERVAL BETWEEN RISING EDGES

CONTROLLER FOR GENERATING A PERIODIC SIGNAL WITH AN ADJUSTABLE DUTY CYCLE

BACKGROUND OF THE INVENTION

1. Field of the Invention

The present invention relates generally to electronic circuits for generating periodic output signals. The present invention relates more specifically to an electronic circuit that allows linear voltage control of the width of a periodically repeating digital pulse, and therefore provides continuously variable duty cycle ratio control of an output clock signal that is synchronous with an input clock signal.

2. Description of the Related Art

One of the most useful electronic circuits is one that generates a digital (a periodic on-off) signal for controlling the operation of one or more digital or digitally controllable devices. It is most useful when the ratio of the on-time during each cycle to the off-time of the cycle, that is, the duty cycle ratio, can be easily varied and controlled. In some embodiments of the basic controller circuit, the linear variance of an analog device, that might for example provide an adjustable voltage, current, or resistance in the circuit, is translated into a linear variation in the duty cycle ratio of the output digital signal.

A number of different types of digitally based duty cycle controllers are known in the art, and may include a modulo-N counter-timer in cascade with a modulo-M counter-timer, where N+M is held constant and defines the output clock frequency, while the period of an input reference clock determines the resolution. Another method employs a shift register having a series of fixed delay interval stages with interposed user selectable taps. According to this method, the output delay or duty cycle ratio is established in discrete steps that depend on the tap selected and on the fixed time delay contributed by each of the internal delay stages.

Normally, the propagation delay of a simple digital gate (or flip-flop) defines the duty cycle adjustment granularity, that is, the shortest incremental delay step achievable. U.S. Pat. No. 5,682,114 issued to Ohta, however, teaches another time delay control technique wherein the differences between the charging time constants of MOSFET gate capacitances provide a relatively shorter single stage delay. Furthermore, each single stage delay can be directly varied by digitally controlling how many MOSFET gate capacitances are connected in parallel at each delay node. Multiple stages can be cascaded for longer delays.

A similar technique for producing short selectable delay intervals is taught in U.S. Pat. No. 5,933,039 issued to Hui et al., wherein the delay at each node is fine-tuned during manufacture. Each nodal capacitance is held constant while the effective nodal charging current is adjusted to properly calibrate each of the individual time delay steps. To achieve longer delay periods, these stages may be concatenated as needed under user programming control.

The basic output element of most analog time delay designs constitutes a detector whose output changes state when a time varying input voltage crosses its input switching threshold. A current source, or a voltage source driving a resistor serving as a voltage-to-current converter, connected to a capacitor generates a time varying voltage that may serve as the input to the detector. Initially, the voltage across the capacitor may be set to a known value to force the detector output into a given state $s_0$. At a particular time, known as the trigger point, current is allowed to flow into the capacitor causing its the voltage to rise until a threshold voltage is reached whereupon the detector output switches to state $s_1$. The time elapsed between these two events is determined by four analog circuit parameters: capacitance, initial capacitor voltage, charging current and detector input switching threshold voltage. If a reset mechanism for the capacitor voltage is provided, this circuit becomes formally equivalent to a retriggerable monostable multivibrator, similar to the well known 555 timer. In principle any one or more of these analog timing parameters can be varied to change the length of the time delay.

The simplest pulse width controller consists of a dual input AND gate, whose inputs exhibit substantially constant and equal switching threshold points, configured with one input being driven directly by the external clock while the other is connected to an RC low pass filter circuit driven by the same external clock; in this case, the voltage developed across the capacitor follows an exponentially decaying curve. With the inputs connected in this manner, the output can assume a logic high value only when the voltages of both the master clock as well as the output of the RC network exceed the gate's input switching threshold, so the duty cycle exhibited at the output of the gate will be determined by the delay due to the low pass filtering action of the RC network. Should the values of either passive element be variable in response to a suitable control signal, then adjustable time delay could be achieved.

Another common technique for analog time delay control is based on the use of an adjustable current source to produce a linear ramping capacitor voltage, with the other three timing parameters identified earlier being held constant. For example, an enhancement recommended for the 555 timer specifies the use of a simple transistor constant current source to linearize the capacitor charging current. Unfortunately, this is only useful for pulse widths down to tenths of a microsecond. In U.S. Pat. No. 4,843,255 issued to Steubing, a design for a fast (500 MHz), step-wise adjustable monostable multivibrator is disclosed wherein the charging current for the timing capacitor is the controlled parameter. By using a voltage controlled current sink to discharge a timing capacitor that has been preset to a known voltage, an accurate time delay is produced at the output of a suitable detector means. The current sink node is the collector terminal of a single common base transistor configured so that a voltage may be impressed across its emitter resistor by a precision DAC. The output of the DAC is connected to provide a relatively negative voltage with respect to the emitter, drawing a current out of the emitter resistor that is substantially equal to the sink current flowing into the collector. Base current compensation is also provided to improve performance.

A continuously variable monostable design, employing a ramp generator consisting of an adjustable current controlled current source and a fixed capacitor, is disclosed in U.S. Pat. No. 5,410,191 issued to Miura, where it appears as an embedded circuit within an FM demodulator. A more sophisticated compound technique to achieve precise timing over relatively long time periods is taught in U.S. Pat. No. 5,124,597 issued to Steubing et al., where the ramp type delay generator described in Steubing (255) is placed in cascade with a series of high speed timer-counter sections. The ramp delay means provides small step-wise vernier delay increments to the primary delay set by a number of cascaded counter-timer stages.

All of the methods described above are examples of open-loop pulse width and timing generators, that could in principle be used as part of a duty cycle controller. However, in every open-loop method, both accuracy and stability are dependent on the absolute values of internal analog quantities such as ramp timing capacitance and nodal charging currents. A significant level of precision can be achieved, but only at the expense of relatively complex circuitry.

On the other hand, a considerable increase in performance can be immediately realized by enclosing a basic retriggerable pulse width modulator within a high gain feedback loop that provides continual correction to the duty cycle ratio of an output clock signal, forcing it to track the value of an input control signal. Because of the fundamental difference in form between the controlling input (an analog voltage or current) and output (a stream of digital pulses), the feedback arrangement takes the form of a servo control loop. An output clock signal that exhibits the duty cycle ratio that is desirably controlled is fed back into the circuitry, where it is filtered to yield an averaged voltage proportional to duty cycle. The difference between the feedback signal and the input control voltage represents the loop error. This error signal serves as the input to a very high gain amplifier configured as an integrator, which, in conjunction with additional circuitry, operates in known fashion within a negative feedback loop to minimize the error by forcing the output duty cycle accurately track the value of the input control signal.

The use of a servo integrator to establish proper time relationships between output signal waveforms was taught by the present inventor in U.S. Pat. No. 4,890,065 issued to Laletin. According to the disclosed technique, an unintentional inter-channel time delay between two related audio input signals is detected and corrected. A time delay between the inputs is determined by at least one analog cross-correlator so that the differential delay is suitably transformed to appear as an error voltage. A high gain amplifier, configured as a servo integrator, receives this error signal and provides control to a pair of voltage controlled time delay networks, each capable of introducing additional delay in their respective audio signal paths. These networks operate differentially under control of the servo integrator to force the inter-channel time delay to be linearly proportional to a controlling voltage signal, usually set to zero. However, using a non-zero control voltage can also effect a constant inter-channel time delay.

Another example of a fixed ratio duty cycle controller that relies on servo feedback is provided in U.S. Pat. No. 5,315,164 issued to Broughton, wherein the output duty cycle of a fixed frequency clock is determined solely by the ratio of two precision resistors embedded within the feedback circuitry. In this case, however, no provision is made for an external duty cycle ratio control input.

McEwan discloses two other examples of the use of a servo integrator to establish precise, adjustable timing relationships in U.S. Pat. No. 5,563,605 and No. 6,055,287. In each disclosure, a high gain amplifier configured as a servo integrator forces the duty cycle of an output clock signal to track a step-wise adjustable reference signal supplied by a DAC. The disclosed circuits employ several (more than three) digital elements, all of which toggle at the reference clock frequency leading to substantial current consumption at higher (>1 MHz) clock frequencies. CMOS logic gates are used as a fixed threshold detectors, each providing an adjustable duty cycle output clock. Instead of linearly varying the ramp slope or the detector threshold, the time delay is achieved by altering the DC bias of a low pass filtered version of the input reference clock that is then presented to the input of the CMOS detector. The edges of the filtered square wave signal exhibit an exponentially decaying shape, so as the filtered waveform is shifted up or down in response to the voltage output signal from the servo integrator, the point in time where each edge of the curved waveform crosses the fixed input threshold of the detector is varied, yielding more or less delay with respect to the edges of the reference clock input signal. Thus, an exponentially decaying waveform edge replaces the linear timing ramp seen in other designs. In principle, the high gain of the servo integrator should ensure that the overall transfer function relating the control input to the output duty cycle remains linear despite the exponential shape of the timing ramp. To achieve significant delays, however, a shallower wave front is required, necessitating more low pass filtering. Such additional filtering also reduces the overall amplitude of the low pass filtered waveform that is presented to the detector as a timing signal; for applications wherein significantly more delay may be required, the amount of filtering required would inevitably yield a waveform too small for reliable detection. For this reason, only a limited amount of delay, about 100 nsec, is actually achievable with this design.

A more elegant servo controlled duty cycle controller is disclosed by Chou, U.S. Pat. No. 6,060,922. A single MOSFET transistor serves as a controlled current source to provide charging current to the intrinsic capacitance of a circuit node. By periodically resetting the nodal capacitance voltage to ground in response to one edge of an external clock signal, a periodically repeating ramping waveform is produced that serves as the input to a logic gate acting as a threshold detector. A feedback arrangement is disclosed to force the averaged duty cycle voltage to be substantially equal to an externally applied reference voltage. An integrator sensing the output waveform directly drives one input of an open-loop operational amplifier while the other amplifier input receives the reference voltage signal. The dominant pole of the very high gain operational amplifier will add to that of the integrator (which itself has very high gain at low frequencies), leading to a potentially unstable system, especially for wide duty cycle ratios at lower clock frequencies. Furthermore, the equivalent input noise of the open loop operational amplifier is not suppressed by any local feedback, and will lead to excessive noise at its output with correspondingly increased timing jitter in the duty cycle ratio. Finally, whenever the input control voltage signal descends to a value corresponding to a sub-minimum pulse width (i.e., requiring a duty cycle having a positive pulse duration less than the sum of the reset time for the capacitor plus the time required for the capacitor's voltage to slew from ground to the detector threshold level), the output of the open loop operational amplifier will saturate at ground, leading to severely non-linear duty cycle performance during the early part of the ramp as a result of the protracted recovery period.

From the above, it is clear that a precision duty cycle controller embodying a voltage controlled, continuously variable pulse width modulator that avoids the shortcomings of previously disclosed designs, and that is stable for a wide range of frequencies and duty cycle ratios, is desirable. It would be especially useful if such a controller could be constructed without requiring either substantial operating current or an excessive number of logic elements operating at a high frequency, and without a plurality of amplifiers that have offset voltage and drift errors which, as a result of their arrangement within the circuit, cannot be corrected by overall loop feedback.

SUMMARY OF THE INVENTION

It is therefore an object of the present invention to provide a continuously adjustable duty cycle controller that uses only one operational amplifier and no more than three CMOS logic elements, which reduces operating current, employs a novel cascode current source permitting operation on a low voltage single power supply, maintains high precision over a wide range of duty cycles through the use of a high gain servo integrator and its associated feedback and filtering circuitry, and retains stability and linear performance when presented with a variable duty cycle ratio controlling signal that may reach zero volts.

It is a further object of this invention to provide a duty cycle controller with at least two clock outputs that can be used together to achieve a time delay function that affords a differential delay range from zero nanoseconds to several thousand nanoseconds.

In fulfillment of this and other objectives, the present invention provides a controller, linearly responsive to an input voltage, having continuously adjustable control of the width of a periodically repeating digital pulse, thereby achieving a linear voltage to duty-cycle ratio transfer function. The circuit of the present invention includes a master clock input, a ratio control voltage input, a controlled duty cycle clock output, reference pulse generator, a reference clock output, a controlled current source, a resettable timing capacitor, a threshold detector, and a high gain amplifier configured as a servo integrator having differential inputs each equipped with a low pass filter.

A capacitor receives a current from a voltage controlled cascode current source yielding a ramping voltage that is transformed into a periodic saw tooth waveform by the resetting action of a switch means responsive to a master clock input. The saw tooth waveform provides an input to a CMOS gate operating as an analog threshold detector whose output changes state whenever the saw tooth waveform crosses its intrinsic input switching threshold. The output of the detector constitutes a pulse width modulated signal, at the same frequency as the master clock. An amplifier that is responsive both to the pulse width modulated signal as well as to a combined control input, operates as a servo integrator within a negative feedback loop to adjust the current source and hence the slope of the ramping voltage, so that the average value of the detector's output waveform, which average is linearly proportional to duty cycle, is equal to the value of the combined control input that is the sum of the value of the ratio control voltage plus the average value of a reference pulse waveform, which average determines the minimum duty cycle ratio achieved when the ratio control input voltage is zero. A reference pulse generator, responsive both to the master clock as well as to the detector output provides a fixed width reference pulse waveform. An inverted copy of the reference pulse waveform serves as the reference clock output signal, where its positive going transitions provide a controllable time delay interval with respect to a controlled duty cycle output which is an inverted copy of the pulse width modulated output of the detector.

BRIEF DESCRIPTION OF THE DRAWINGS

FIGS. 2A–2K are graphic representations of various signals present in the circuitry of the present invention as referenced A–I in FIG. 1.

DETAILED DESCRIPTION OF THE PREFERRED EMBODIMENT

Throughout the appended drawings, the same reference numbers are used to designate the same or similar components.

Figure 1:
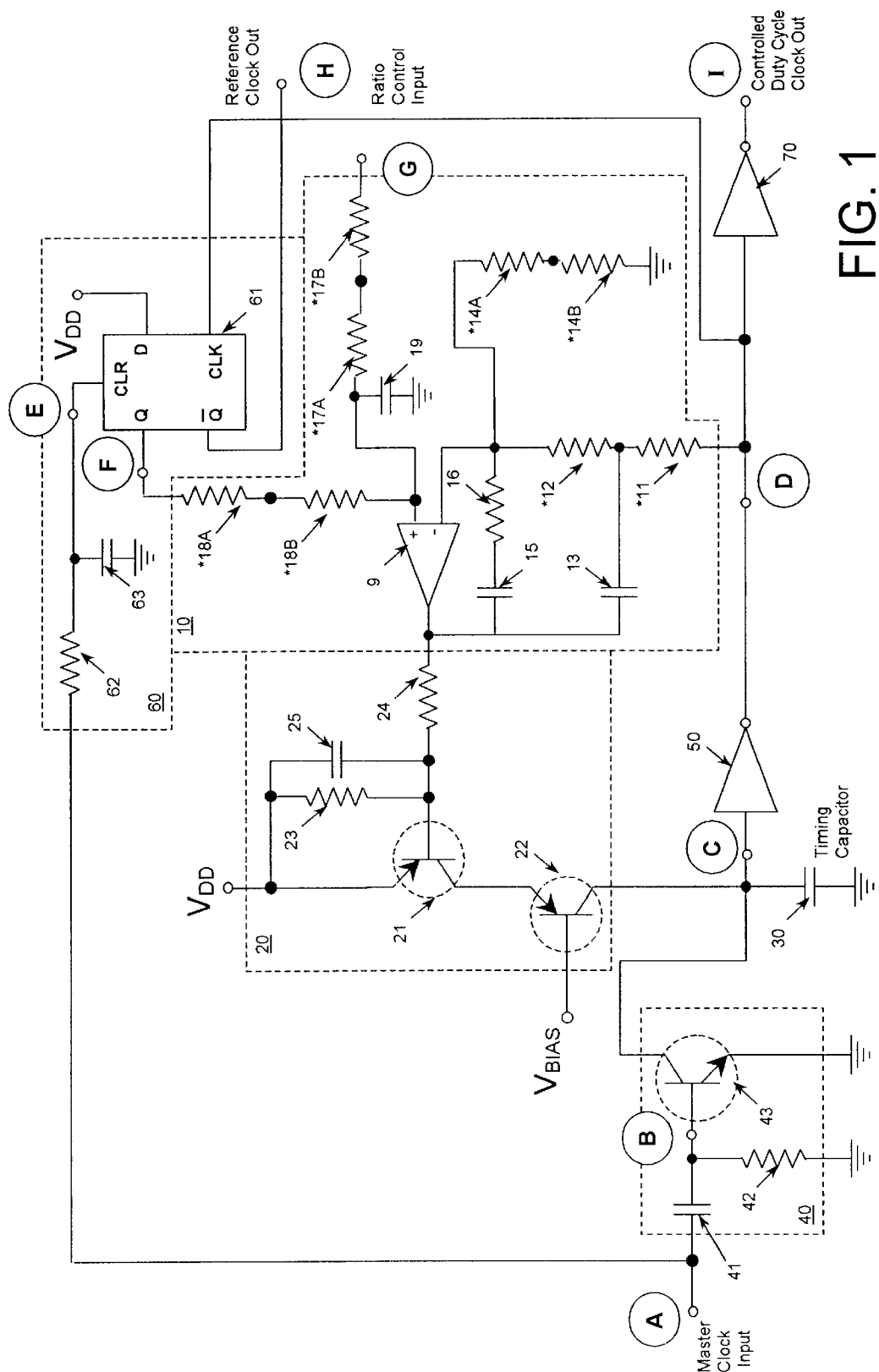
FIG. 1 is an electronic schematic diagram of the duty cycle controller circuit of the preferred embodiment according to the present invention.

Reference is made first to FIG. 1 for a description of the basic circuit structure and function for the present invention. FIG. 1 illustrates the arrangement of a pulse width controlled duty cycle generator according to the present invention. The basic elements of the circuit include integrator 10, voltage controlled current source 20, capacitor 30, reset switch 40, invert gate 50, reference pulse generator 60, and output clock buffer 70. During normal operation, while this circuit is providing controlled width output pulses at nodes D and I, the inputs presented to integrator 10 are sufficient to ensure that its output voltage keeps voltage controlled current source 20 properly biased and capable of supplying some level of output current to timing capacitor 30.

Reset switch 40 is composed of a high frequency NPN transistor 43 (such as an AT-30533 HP device), that is briefly turned on at each rising edge of the master clock by the short pulse produced by RC differentiating network 41 and 42. This brief ON time constitutes the reset interval for capacitor 30, during which interval any charge and voltage, accumulated on timing capacitor 30 as a result of charging current received from current source 20, is removed, effectively resetting the ramp voltage to zero.

Figure 2F:
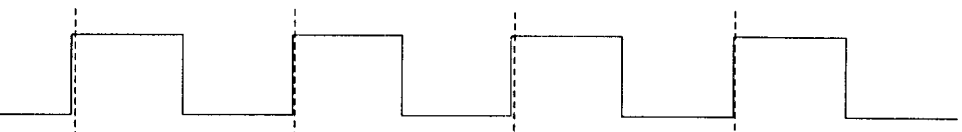
Figure 2G:
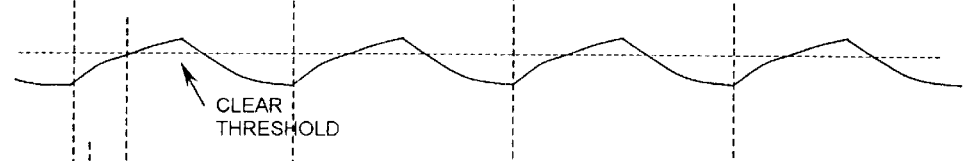
Figure 2H:
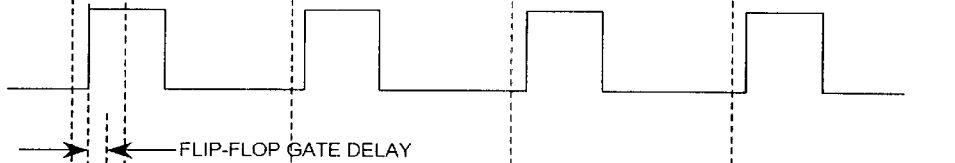
Figure 2I:
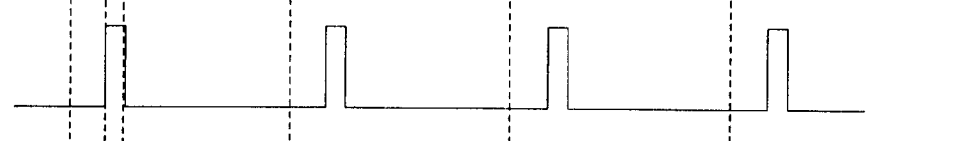
Figure 2J:
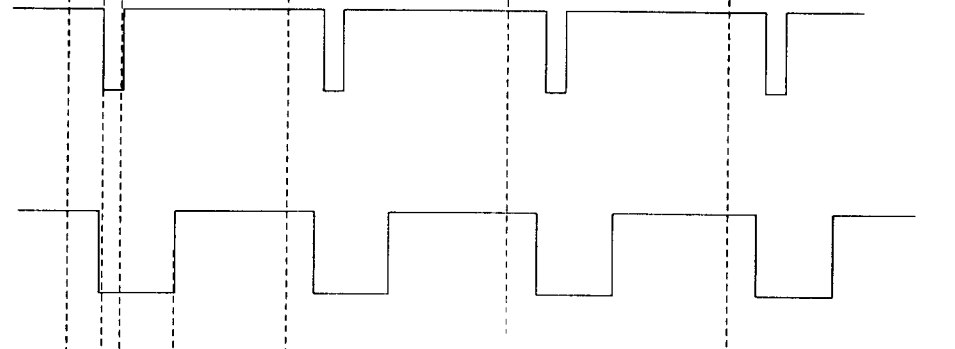
Figure 2K:
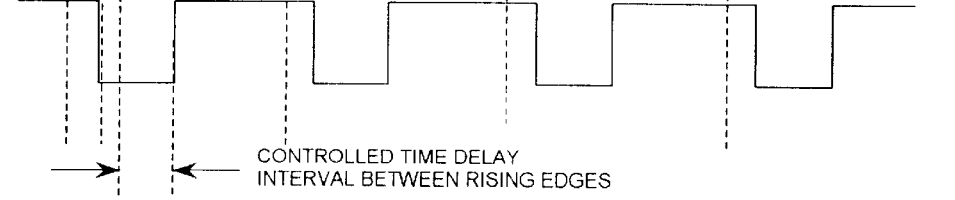

When reset switch 40 is turned OFF, the voltage across capacitor 30 assumes the form of a linearly rising ramp until it reaches its maximum value at the collector saturation voltage of transistor 22 within current source 20; the slope of the ramp is directly proportional to the magnitude of the charging current. The capacitor voltage will remain at its maximum value until the next reset occurs. Immediately after being reset, the voltage presented by capacitor 30 will be well below the saturation point of current source 20, so current again will flow into capacitor 30, giving rise to another linearly ramping voltage. This cycle repeats at the frequency of the master clock input, provided at node A (see FIG. 2A) yielding a flat-topped saw tooth waveform as shown in FIG. 2C-1. If the interval between successive reset pulses is too short for the ramp voltage to reach its maximum value, a more regular saw tooth waveform, lacking a flat top, is generated, as in FIG. 2C-2. It should be noted that the use of capacitor 30 is optional, as the intrinsic input nodal capacitance of the invert gate 50 may be sufficient for current source 20 to produce a satisfactory saw tooth waveform.

Referring again to FIG. 1, current source 20 comprises two transistors, along with the associated components 23, 24, and 25 which provide voltage-to-current conversion (and some filtering) for the drive signal provided by amplifier 9. The first transistor 21 is a high gain PNP bipolar type (such as a BC860C device) and the second transistor 22 is a high frequency PNP bipolar type (such as a MBTH81 Fairchild device). The series arrangement of these two devices is known as a cascode connection, which has the advantage of being able to provide substantially increased dynamic output impedance and better high frequency response in comparison to a single device implementation. In addition, the PNP RF transistor 22 connected in cascode with transistor 21 presents a much smaller collectorbase (Miller) capacitance to the current output node than would transistor 21 if used by itself. This is important since any parasitic capacitance at this otherwise high impedance node will tend to reduce the maximum attainable slew rate of the voltage at this node, and, as will become apparent below, will contribute unwanted phase shift to the overall transfer function of the loop that could lead to instability.

The base of PNP transistor 21 is driven by the output of integrator 10 via a voltage divider comprised of resistors 23 and 24, while the base of PNP transistor 22 is biased by a suitable low impedance source (not shown), at a constant DC voltage $V_{BIAS}$ (2 VDC), about one volt below $V_{DD}$ (3 VDC) in the preferred embodiment. Changes in the base current of transistor 21 proportionately modulate its collector current, which flows directly into the emitter terminal of cascode transistor 22. Because transistor 22 is configured as a common base amplifier, it exhibits a current gain closely approaching unity, so its collector output current is substantially equal to its emitter current as provided by transistor 21. Thus when the base drive current to transistor 21 increases, the collector current of transistor 22 increases commensurately, so that the two transistors behave together as a high precision current source. Because of the low emitter-collector saturation voltage of bipolar cascode transistor 22, the voltage compliance of the overall current source closely approaches the full available supply $V_{DD}$, which permits proper circuit operation with low supply voltages.

As is known to those practiced in the art, a key benefit conferred by a cascode buffering device such as transistor 22 is that, by virtue of the negligible AC impedance presented by the voltage source used to bias its base, it is immune to bandwidth degradation due to local feedback through the Miller (collector-base) capacitance. In addition, unwanted phase shift within the feedback loop is reduced, allowing the duty cycle controller to operate in a stable condition, free from spurious oscillations that would otherwise severely compromise its ability to create very wide duty cycle ratios over a broad range of operating frequencies. Furthermore, the emitter of transistor 22 establishes a collector bias point for preceding transistor 21 that remains substantially constant and independent of variations in load voltage presented by the saw tooth waveform that evolves at the collector of transistor 22. Because there is virtually no AC signal present at the collector of current source transistor 21, it too is immune to Miller capacitance feedback that would reduce its gain and increase phase shift within the feedback loop and therefore cause the circuit to become unstable.

During operation of the preferred circuit, a well formed saw tooth voltage waveform is present across capacitor 30. In contrast, when the cascode transistor has been omitted so that the collector of the current source transistor 21 connects directly to timing capacitor 30, a waveform distorted by spurious low frequency oscillation obtains instead. The severe low frequency amplitude envelope modulation is due to feedback loop instability arising from the excessive phase shift contributed by the Miller feedback between the base and collector nodes of current source transistor 21.

The saw tooth waveform (FIG. 2C-2) is presented to the input of CMOS invert gate 50 (such as a NC7SZ04 Fairchild device) which serves as a detector with a fixed switching threshold. When the waveform voltage is below the threshold, the output of gate 50 will assume a logic high value, within a few millivolts of $V_{DD}$; conversely, when the voltage is above the switching threshold, the output of the invert gate 50 will be at a logic low level, a few millivolts from ground as shown in FIG. 2D. In response to the sawtooth input, detector 50 outputs a signal whose value alternates between logic high and logic low, such that the interval between each rising edge transition and the subsequent falling edge defines a positive pulse. In normal circuit operation, this duration of this positive pulse is determined by the interval between the falling edge of the sawtooth ($t_0$ in FIG. 2C-2) as it is reset and that point in time ($t_1$ in FIG. 2C-2) when the ramping voltage crosses the input switching threshold $V_{TH}$ of gate 50. As the current supplied to capacitor 30 is increased or decreased, the width of the positive pulse decreases or increases, respectively, while the repetition frequency of the pulses remains equal to that of the master clock. Through a suitable application of negative feedback control this pulse width can be made to always stand in linear proportion to a ratio control voltage input.

The reference pulse generator 60 develops a periodic output signal consisting of constant width positive pulses, at the frequency of the master clock, in a manner more easily apprehended by reference to FIG. 2. In response to each rising edge transition of the master clock (node A), reset switch 40 forces the voltage across capacitor 30 to zero, causing the output of detector 50 to undergo a fast transition to a logic HIGH state. The rising edge triggered CLOCK input of flip-flop 61 is responsive to each positive-going transition at the output of detector 50. By virtue of a connection between $V_{DD}$ and the DATA input of flip-flop 61, the flip-flop responds to said transition by simultaneously placing its Q output at logic HIGH and its Q-bar output at logic LOW. The master clock also drives an RC low-pass network, comprised of resistor 62 and capacitor 63, that connects to the level sensitive CLEAR input of flipflop 61. The values of 62 and 63 are preferably chosen so that the voltage of the signal presented to the CLEAR input reaches the input's threshold about 25 nanoseconds after each rising edge of master clock input (node A). Referring to FIGS. 2F and 2H, when CLEAR is so asserted, the Q output of flip-flop 61 at node F (FIG. 2F) assumes a logic LOW state, while the Q-bar of flip-flop 61 (FIG. 2H) output reverts to logic HIGH; both of these transitions occur virtually simultaneously, and both are delayed with respect to the activation of the CLEAR input, by a substantially constant interval termed the gate propagation delay (typically several nanoseconds). It can be seen that the signal present at the Q output of flip-flop 61 appears as a train of positive pulses each of a substantially constant duration of about 25 nanoseconds, equal to the time interval between activation of the CLOCK and CLEAR inputs, respectively, while the Q-bar output provides an inverted version. The train of constant width positive pulses issuing from the Q output at node F constitutes a reference pulse signal having a substantially constant, positive average value.

The waveform produced by the invert gate 50 at node D is directed to a low pass filter network comprised of equal valued resistors, 11 and 12 and capacitor 13 that yields a smoothed output voltage substantially equal to the time average of its input. This time averaged voltage feeds the inverting input of high gain differential amplifier 9. A network comprised of two equal resistors, 14A and 14B, whose sum is equal to the sum of resistors 11 and 12, is connected between the inverting input and ground, achieving a 2:1 voltage divider function in conjunction with resistors 11 and 12, such that the average signal amplitude at the inverting input node of amplifier 9 is exactly equal to one half of the effective average of that signal presented by detector 50 to resistor 11.

The non-inverting input of amplifier 9 receives signals both from an external ratio controlling voltage source, via equal valued resistors, 17A and 17B, as well as from the Q output of flip-flop 61 via equal valued resistors 18A and 18B. Since the non-inverting input of amplifier 9 exhibits a very high impedance, resistor networks 17A/17B and 18A/18B form a 2:1 voltage divider operative such that the voltage presented to the non-inverting amplifier input is one-half of the sum of the individual voltages present at nodes F and G. Capacitor 19 serves to reduce the voltage ripple at the input of amplifier 9.

In the preferred embodiment, each of the eight resistors (11, 12, 14A, 14B, 17A, 17B, 18A, 18B) marked with an asterisk in FIG. 1 are particularly manufactured to exhibit intrinsically low temperature drift, and are all integrated on the same substrate (such as in BI part type NQS16A4702B) to achieve close thermal tracking, yielding typical ratio matching of several parts per million per degree centigrade. While any residual drift in the values of these resistors cannot be corrected by negative feedback, the magnitude of the resulting error is far below the noise floor of the circuitry, and so can be considered negligible.

The output of amplifier 9 provides drive current to transistor 21 within current source 20, via a voltage divider comprised of resistors 23 and 24.

The integrator 10/filter 60 arrangement shown in the preferred embodiment of the present invention is itself unique. One terminal of capacitor 13, which in conjunction with resistors 11 and 12 constitutes a single pole low pass filter, is connected to the output of amplifier 9, instead of being connected to ground as would be typical. In this case the novel arrangement of capacitor 13 along with and resistors 11 and 12 provides the optimum filtering without compromising loop stability.

The functional core of integrator 10 comprises operational amplifier 9 (such as an OPA340 Burr Brown device) which performs as an integrative element by virtue of the local feedback afforded by the series combination of resistance 16 and capacitance 15, which capacitance blocks direct current flow allowing the effective gain at DC and low frequencies to approaches the full open loop gain of amplifier 9. Resistor 16 inserts a zero into the overall transfer function and is specifically required to preserve overall loop stability. Operational amplifier 9 functions as known such that the algebraic difference between its two input signals is multiplied by its open loop gain and provided at its output node, where it serves ultimately as the input to current source transistor 21. By virtue of the negative feedback connection of amplifier 9 within the context of the entire circuit, integrator 10 operates as a servo control amplifier, such that its output assumes whatever value is required to force current source 20 to create a duty cycle controlled clock at the output of invert gate 50 that maintains an average value that remains substantially equal to the sum of the ratio controlling input voltage provided at node G plus the average value of the reference pulse signal present at node F.

In the event that the externally supplied ratio control voltage is exactly zero, the clock signal provided by detector 50 will not vanish, that is, contain only zero width pulses, but instead will appear as a stream of brief positive pulses whose time average will precisely equal the average value of the signal created by reference pulse generator 60. As long as the power supply voltages provided to detector 50 and flip-flop 61 are equal, then the amplitude of their respective output pulses will be equal, which ensures that for a ratio control input voltage of zero, the width the positive pulses at the output of detector 50 will equal the width of the positive pulses provided by the reference pulse generator. This equality establishes, in conjunction with the period of the master clock, a minimum duty cycle ratio for the circuit.

The existence of a non-zero minimum duty cycle due to the constant bias afforded by the reference pulse clock also guarantees that amplifier 9 will always be properly operative and never experience output saturation at ground. Were such a constant bias not provided for amplifier 9, it's output would be forced into negative saturation should the ratio control voltage ever become less than the minimum achievable average value of the controlled duty cycle clock, where the corresponding minimum clock pulse width is determined jointly by the saw tooth ramp reset time and the maximum voltage slew rate attainable across capacitor 30. Because it can take up to several hundred microseconds for an amplifier to recover from saturation, the provision of a constant bias to amplifier 9 to guard against a saturation condition is essential for maintaining the desired linear relationship between ratio control voltage and the duty cycle of the controlled clock output, especially if some specific application of the disclosed design would permit the ratio control input to reach zero during normal circuit operation.

Note, however, that an excessively wide reference pulse may unduly limit the maximum obtainable duty cycle ratio, while too short a short reference pulse (approaching an absolute minimum controllable positive pulse width of several nanoseconds at node D) can lead to instability. While drift in RC elements 62 and 63 may tend to change the width of the reference pulse slightly from its preferred value of about 15 nanoseconds, it will become apparent from the discussion to follow that the accuracy of the controlled delay interval is not affected.

For some applications, it may be useful for the controlled delay interval to be defined as that time delay between two successive events, such as for example the corresponding rising-edge transitions of two periodic digital clock signals that are operative at the same frequency and are properly aligned to execute negative-going transitions simultaneously. With reference to the signals identified in FIG. 1, the time delay that obtains between each rising edge of the periodic clock signal present at node H and each corresponding (and usually somewhat delayed) rising edge transition in the clock signal at node I represents such a controllable interval, as will become apparent from the following description.

By virtue of the negative feedback loop operative within the disclosed invention, the duty cycle of the pulse width modulated clock appearing at node D in FIG. 1, is controlled to vary as a linear function of the ratio control voltage provided at node G, which voltage may periodically assume a zero value. Since the frequency of said pulse width modulated clock at node D is constant and equal to the frequency of the master clock provided at node A, the width of each positive pulse appearing at node D will also be linearly related to the voltage of the ratio control input signal, where said pulse width will, when the control voltage is zero, exhibit a minimum value equal to the fixed width of the reference pulses appearing at node F, and may at other times exhibit a maximum value of perhaps several thousand nanoseconds when the control voltage reaches its highest point. An invert gate 70 receives the signal from node D, and produces at node I an inverted copy that may usefully be characterized as a stream of negative pulses, which copy is slightly delayed in time due to the characteristic propagation delay of a logic gate. Because the effect of propagation delay applies to both pulse edges equally at node I, the duty cycle of the signal at node I, and hence the width of said negative pulses, remain linearly responsive to the value of the ratio control voltage input.

As described previously, the transitions defining the short pulses appearing at the Q and Q-bar outputs of flip-flop 61 are similarly delayed by a small fixed amount with respect to their respective controlling signals (e.g., CLOCK and CLEAR).

Provided that invert gate 70 and flip-flop 61 are fabricated on the same silicon die, as for example, within the same programmable logic gate array device, their gate propagation delays will be nearly identical and tend to track over time, temperature and $V_{DD}$ variations and therefore not contribute error to the timing accuracy of the overall circuit.

From FIGS. 2A–2I, it is apparent that since each of the pulses at nodes F, H and I are initiated by the same rising-edge transition at node D, and each of these pulses is delayed by the same fixed propagation delay, then the leading edges of said pulses will be precisely synchronous. Recalling that the width of the pulses at nodes D and I are constrained to be a linear function of the control voltage input, with a minimum value equal to the reference pulse width (for a control voltage of zero), then it follows that the time interval between the corresponding rising edges at node H and node I will be a linear function of the ratio control voltage, where said delay interval may assume a value as small as zero, up to several thousand nanoseconds.

In summary, it is apparent from FIGS. 3A–3C that each falling-edge transition of the Q-bar output at node H will align precisely with the corresponding falling edge transition at node I, and the time delay interval obtaining between the subsequent rising edges will remain a linear function of the ratio control voltage input, and specifically, said rising edges will become precisely coincident and so exhibit a relative delay of zero, whenever the ratio control voltage assumes a zero value. In this manner, the desired time delay control function between the rising edges of two related output clock signals is obtained.

The stability and accuracy of the above described circuit is determined primarily by the input offset errors and drift of the particular operational amplifier selected, since any other variance arising from components located within the feedback loop will be divided by the amplifier's very large gain and so rendered negligible. Additional accuracy can be obtained by providing that the voltage source used as the reference for the ratio control input signal tracks, or is the same as, the power supply voltage provided to CMOS logic elements 50 and 61. This will ensure that although the amplitude of their output pulses may change due to small power supply variations, such a changes will be precisely compensated for by a commensurate change in the relative amplitude of the ratio control input, thus preserving accuracy.

The input control voltage may vary continuously (from zero to within a few millivolts of the supply), allowing the duty cycle to be swept continuously, provided that the sweep frequency is at least several decades lower than the input clock frequency. For a wide range of clock frequencies (around 200 KHz to 5 MHz, for example), duty cycles exceeding 90% may be readily achieved, yielding controlled pulse widths and corresponding delays reaching thousands of nanoseconds. Current consumption by the switching components is minimized by limiting these to only three CMOS devices, 50, 61, and 70. For periods when the output pulses are not required, the quiescent current can be considerably reduced by disabling the master clock.

A representative example of an application of the above described pulse width controller, with its ability to provide very well controlled variable time delays, is in the field of Time Domain Reflectometry distance measurement. Time Domain Reflectometry is a technique wherein short electrical pulses are generated and propagated through a waveguide, such as a single wire, a pair of adjacent wires, or a coaxial cable. With proper coupling techniques, these pulses propagate along the waveguide as transverse electromagnetic waves. When an impedance discontinuity is present somewhere along the waveguide, a reflected wave front (or pulse) propagating back toward the source is produced. The speed of propagation of a transverse wave can be determined for the particular waveguide, so the distance between the source and the discontinuity can be calculated from the measured round trip time of flight of the returning echo signal. This method is especially useful for determining the level of fluid or granular solids inside a tank: the waveguide is inserted vertically into the tank, and the surface of the substance serves as the impedance discontinuity producing the reflected pulse.

In this application therefore, it is desirable to use each of the rising edges at nodes H and I (FIGS. 2H and 2I, and FIGS. 3A–3C) that define the controlled time interval, to create the two signals required, which are specifically: a brief positive pulse that may be used to turn on a common emitter switching transistor, resulting in a rapidly descending collector voltage can be differentiated into a very short (~1 nanosecond) negative pulse suitable for use as a radar transmit pulse; and a gating pulse for a high speed diode sampler configured to capture incrementally delayed samples of a periodically repeating pattern of echoes that appear on an antenna in response to a corresponding periodic series of transmit pulses, which samples are suitable for use as an Equivalent Time representation of said antenna echo profile.

In a vacuum, electromagnetic waves travel at about $3^x 10^{10}$ centimeters per second (that is, c, the speed of light) and at a significant fraction of c along a typical waveguide such as a straight wire or rod. At this speed, a pulse will move about 1 foot per nanosecond ($1^x 10^{-9}$ sec) along the waveguide. To achieve precise distance determination directly, extremely small time of flight intervals, on the order of hundredths of a nanosecond for 0.1" precision, would have to be measured accurately. To circumvent this technical problem, a technique known as Equivalent Time Sampling has been developed and widely used. As is well known to those familiar with high speed data sampling techniques, Equivalent Time Sampling relies on having a periodic data stream available (e.g., a continuous stream of many consecutive, identical cycles of waves or pulses), from which a single sample is acquired during each consecutive cycle. A large number of samples is acquired with each consecutive sample being taken at a slightly later relative time in the cycle than the previous one. Provided only that the signal being sampled is periodic and substantially unchanging in time, the net effect of taking a single progressively delayed sample from each of many identical cycles is equivalent to taking many closely spaced samples from a single cycle in real time. The benefit is that the effective sampling rate is established not by the actual time between each successive pair of samples (typically hundreds of nanoseconds), but instead equals the reciprocal of the small, incremental delay in timing interposed between successive samples, which yields an effective time between samples of just tens of picoseconds. This is commonly known as a swept gate sampling method, since the time delay between a reference point in time, usually corresponding to the issuance of a transmit pulse, and the acquisition point of each consecutive sample is swept uniformly across a range of values corresponding to the expected range of round trip time of flight transit times for the particular waveguide employed.

By storing (e.g., averaging or integrating) these samples, a faithful representation of the high speed events that occurred on the antenna may be created in a more convenient form, as can be appreciated from the following description.

A saw tooth voltage ramp with a duration of tens of milliseconds normally referred to as the Equivalent Time ramp is preferably used as the ratio control input to the disclosed duty cycle control circuit. With this input, the delay afforded by the circuit will sweep in linear fashion across a range of values, from about zero to hundreds of nanoseconds. The actual maximum delay achieved depends jointly on the peak value of the Equivalent Time saw tooth ramp and the power supply voltage provided to logic elements 50 and 61 (FIG. 1). Since each consecutive sample is stored as it is acquired, and preferably persists intact at least until the next sample is taken, a faithful representation of the fast real time signal on the antenna may be recreated in Equivalent Time (by concatenating such samples in a memory device for later use, or displaying them sequentially as the are acquired on an oscilloscope), where the duration of the ET signal equals the duration of the sloped part of the saw tooth ramp. Because this Equivalent Time signal evolves at a much slower rate than the actual signal being sampled (e.g., a radar echo profile spans just hundreds of nanoseconds in real time), it can be immediately displayed and easily manipulated (viz., filtered and used to drive a detector). Events occurring over extremely short time intervals, such as the duration of a round trip time-of-flight of an electromagnetic pulse between a TEM wave radar transceiver and a liquid surface, are now reconstituted as a down-converted Equivalent Time signal that can be easily measured using inexpensive circuitry, and translated mathematically to yield accurate values for distances to detected target echoes.

To fully realize the benefit of Equivalent Time Sampling in the field of art described above, consider the following example. The real-time sampling clock (and pulse transmit frequency) is set at 2 MHz, yielding 500 nsec intervals between actual samples. The slope of the 10 msec duration swept gate ramp is adjusted so that the real delay time sweeps over a 100 nsec range, yielding an effective range of about 50 feet (at 2 nsec per foot, round trip time of flight}. During the 10 msec ramp, 20,000 actual samples are acquired over that 50 foot range (10 msec sweep event/500 nsec per sample=20,000 samples) Assuming a linear ramp, then the apparent 'distance' between consecutive samples is 0.03 inch (600 inches/20,000 samples). To achieve this resolution in real time would require the samples to be taken at 5 picosecond intervals (2 nsec per foot=167 picoseconds per inch, so 167 picoseconds×0.03 inch per sample=5 picoseconds per sample). However, in Equivalent Time, the time differential corresponding to 0.03 inch is 500 nsec (10 msec sweep/20,000 samples), which can be readily detected with a moderately fast, inexpensive analog comparator.

The key to the accuracy of the above technique is being able to produce a series of clock pulses exhibiting uniformly increasing pulse widths, established by an Equivalent Time linear ramp signal. The leading edge of each clock pulse controls a transmitter, while the trailing edge of these pulses is used to control a high speed voltage sampler connected to the wave guide. For certain applications, it may be desirable to place a fixed time delay in the transmit control path (to delay the output of the transmit pulse), so that during the initial part of the swept gate ramp, the early sampling pulses actually occur before the transmit pulse is generated, and sweep across its location in time as the ramp evolves. This allows not only the detection of returning echo signals, but also the details of the transmit pulse itself.

Many features and advantages of the present invention are discernable from the detailed specification and the attached figures. It is therefore intended by the appended claims to cover all such features and advantages of the invention that fall within the spirit and scope of the invention. Furthermore, since numerous modifications and variations will readily occur to those skilled in the art, it is not desired that the present invention be limited to the exact construction and operation illustrated and described herein. Accordingly therefore, all suitable modifications and equivalents that may be resorted to are intended to fall within the scope of the claims. Although the invention has been described with reference to specific embodiments, this description should not be construed as limiting. Various modifications of the disclosed embodiments, as well as alternative embodiments of the inventions will become apparent to persons skilled in the art upon reference to the description of the invention. It is, therefore, contemplated that the appended claims will cover such modifications that fall within the scope of the invention.

I Claim:

1. A pulse width controller circuit for generating a periodic digital output signal, the controller circuit comprising:
   a voltage controlled current source;
   a timing capacitor connected to said current source;
   a reset switch circuit, said switch circuit connected in parallel with said timing capacitor and driven by an input clock signal;
   an invert gate serving as a detector, the input of said invert gate connected to said current source and said timing capacitor;
   a low pass filter circuit connected to the output of said invert gate; and
   an integrator circuit having an inverting input connected to said low pass filter, a non-inverting input connected to an external ratio control voltage source, and an output connected to and providing the control voltage for said voltage controlled current source, wherein said integrator circuit operates as a servo control amplifier such that its output will adjust the duty cycle of the waveform appearing at the output of said invert gate so that its average value is substantially equal to said external ratio control voltage.

2. The controller circuit of claim 1 wherein said integrator circuit comprises an operational amplifier device having a local feedback loop.

3. The controller circuit of claim 1 wherein said voltage controlled current source comprises:
   a first bipolar transistor device wherein the base of said transistor receives an input control voltage for said voltage controlled current source; and
   a second bipolar transistor in cascode connection with said first bipolar transistor.

4. The controller circuit of claim 1 wherein said reset switch circuit comprises:
   a high frequency transistor;
   a base shunt resistor; and
   a base input coupling capacitor, said capacitor receiving said input clock signal.

5. The controller circuit of claim 1 wherein said invert gate comprises a CMOS device having an input switching threshold voltage, said CMOS gate operating as an analog threshold detector.

6. The controller circuit of claim 1 wherein said low pass filter comprises:
   a first resistor connected to the output of said invert gate;
   a capacitor connected between said first resistor and the output of said integrator circuit; and a second resistor connected between a combination of said first resistor and said capacitor and said inverting input of said integrator circuit.

7. The controller circuit of claim 3 wherein said second bipolar transistor is biased at a constant bias voltage, said bias voltage approximately 1 VDC less than a source voltage for said first bipolar transistor.

8. The controller circuit of claim 1 wherein said timing capacitor comprises an integral element of said invert gate.

9. A method for controlling the pulse width of a periodically repeating digital pulse using an input control voltage, the method comprising the steps of:

providing an input control voltage, said control voltage directly related to a desired duty cycle ratio for said digital pulse;

integrating said control voltage with a feedback signal to provide an output voltage signal;

providing a voltage controlled direct current flow, said current flow controlled by said output voltage signal;

generating a ramping voltage with a capacitance from said current source to ground;

providing an input digital clock signal having a frequency;

periodically resetting said ramping voltage at said frequency of said clock signal, said resetting action forming a saw tooth waveform;

detecting a threshold voltage crossing in said saw tooth wave form;

generating a digital signal correlated to said detected threshold voltage crossing; and generating said feedback signal through a filter from said generated digital signal, a pulse width of said generated digital signal correlated to said input control voltage.

10. The method of claim 9 wherein said step of providing a voltage controlled direct current flow comprises the steps of:

driving the gate of a bipolar transistor current source with said output voltage signal;

providing a common base bipolar cascode output device in series with the drain of said bipolar transistor; and biasing the base of said bipolar device with a fixed voltage.

11. The method of claim 9 wherein said step of detecting a threshold voltage comprises providing an invert gate having an input connected to receive said saw tooth waveform and said step of generating a ramping voltage with a capacitance from said current source to ground comprises generating a ramping voltage with the input nodal capacitance of said invert gate.

* * * * *